(12) United States Patent
Liu et al.

(10) Patent No.: US 8,669,558 B2
(45) Date of Patent: Mar. 11, 2014

(54) PIXEL STRUCTURE AND ELECTRICAL BRIDGING STRUCTURE

(75) Inventors: Ching-Yang Liu, Hsin-Chu (TW);
Wei-Hsiang Lin, Hsin-Chu (TW);
Shu-Wei Chu, Hsin-Chu (TW);
Hsiang-Chih Hsiao, Hsin-Chu (TW);
Jhih-Jie Huang, Hsin-Chu (TW);
Sai-Chang Liu, Hsin-Chu (TW);
Yu-Hsing Liang, Hsin-Chu (TW)

(73) Assignee: AU Optronics Corp., Science-Based Industrial Park, Hsin-Chu (TW)

(*) Notice: Subject to any disclaimer, the term of this patent is extended or adjusted under 35 U.S.C. 154(b) by 135 days.

(21) Appl. No.: 13/349,554

(22) Filed: Jan. 12, 2012

(65) Prior Publication Data

US 2012/0292622 A1    Nov. 22, 2012

(30) Foreign Application Priority Data

May 17, 2011 (TW) .............................. 100117211 A

(51) Int. Cl.
*H01L 29/04* (2006.01)
(52) U.S. Cl.
USPC .................................... 257/59; 257/E51.019

(58) Field of Classification Search
USPC ............................. 257/59, 72, 758, E51.019
See application file for complete search history.

(56) References Cited

U.S. PATENT DOCUMENTS

| | | | |
|---|---|---|---|
| 4,436,582 A * | 3/1984 | Saxena ........................... | 438/571 |
| 6,195,138 B1 * | 2/2001 | Shimada et al. ................ | 349/42 |
| 8,143,622 B2 | 3/2012 | Cheng | |
| 2001/0002857 A1 | 6/2001 | Shimada | |
| 2008/0272370 A1 | 11/2008 | Endo | |

FOREIGN PATENT DOCUMENTS

| | | |
|---|---|---|
| CN | 1172962 A | 2/1998 |
| CN | 101963729 A | 2/2011 |
| TW | 1331788 | 10/2010 |

* cited by examiner

*Primary Examiner* — Mark Prenty
(74) *Attorney, Agent, or Firm* — Winston Hsu; Scott Margo

(57) ABSTRACT

A pixel structure includes a thin film transistor device, an insulating layer disposed on the thin film transistor device, and a pixel electrode disposed on the insulating layer. The thin film transistor device includes a floating conductive pad disposed at one side of a semiconductor layer, and electrically connected to a source/drain electrode. The insulating layer has a first contact hole partially exposing the floating conductive pad. The pixel electrode is electrically connected to the floating conductive pad via the first contact hole.

21 Claims, 6 Drawing Sheets

PIXEL STRUCTURE AND ELECTRICAL BRIDGING STRUCTURE

BACKGROUND OF THE INVENTION

1. Field of the Invention

The present invention relates to a pixel structure and an electrical bridging structure, and more particularly, to a pixel structure and an electrical bridging structure having a floating conductive pad that can enhance an improved interface for electrical charge injection.

2. Description of the Prior Art

Active matrix flat display panel, such as liquid crystal display panel, uses thin film transistor (TFT) devices as its driving devices. Normally, inorganic semiconductor material, due to its higher carrier mobility, has been widely used as the material of semiconductor layer in thin film transistor device. Compared with inorganic semiconductor material, organic semiconductor layer has lower carrier mobility. Nevertheless, organic semiconductor material is advantageous for its flexibility and compatibility of low temperature process, and thus has been attempted to fabricate thin film transistor device. However, in the fabrication of organic semiconductor thin film transistor device, the source/drain electrode is apt to be oxidized, which causes poor electrical connection between the source/drain electrode and the pixel electrode to be formed successively. Consequently, the development of organic semiconductor thin film transistor device is limited.

SUMMARY OF THE INVENTION

It is therefore one of the objectives of the present invention to provide a pixel structure and an electrical bridging structure to improve the electrical performance of thin film transistor device and display panel.

According to a preferred embodiment of the present invention, a pixel structure disposed on a substrate is provided. The pixel structure includes a thin film transistor device disposed on the substrate, an insulating layer disposed on the thin film transistor device, and a pixel electrode disposed on the insulating layer. The thin film transistor device includes a semiconductor layer disposed on the substrate, a gate electrode disposed on the substrate, a gate insulating layer disposed between the semiconductor layer and the gate electrode, two source/drain electrodes disposed on the substrate and corresponding to two opposite sides of the semiconductor layer, respectively, and a floating conductive pad disposed on the substrate and disposed at one side of the semiconductor layer. The floating conductive pad is electrically connected to one of the source/drain electrodes. The insulating layer has a first contact hole partially exposing the floating conductive pad. The pixel electrode is electrically connected to the floating conductive pad via the first contact hole.

According to a preferred embodiment of the present invention, an electrical bridging structure disposed on a substrate is provided. The electrical bridging structure includes a conductive line, a floating conductive pad, an insulating layer and a conductive layer. The conductive line is disposed on the substrate, and the material of the conductive line includes at least one of silver, aluminum, copper, and magnesium, or a composite layer thereof, or an alloy thereof. The floating conductive pad is disposed on the substrate and electrically connected to the conductive line, and the material of the floating conductive pad includes an antioxidant material. The insulating layer is disposed on the floating conductive pad, and the insulating layer has a contact hole partially exposing the floating conductive pad. The conductive layer is disposed on the insulating layer and electrically connected to the floating conductive pad via the contact hole.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to the skilled users in the technology of the present invention, preferred embodiments will be detailed as follows. The preferred embodiments of the present invention are illustrated in the accompanying drawings with numbered elements to elaborate the contents and effects to be achieved.

Figure 1:
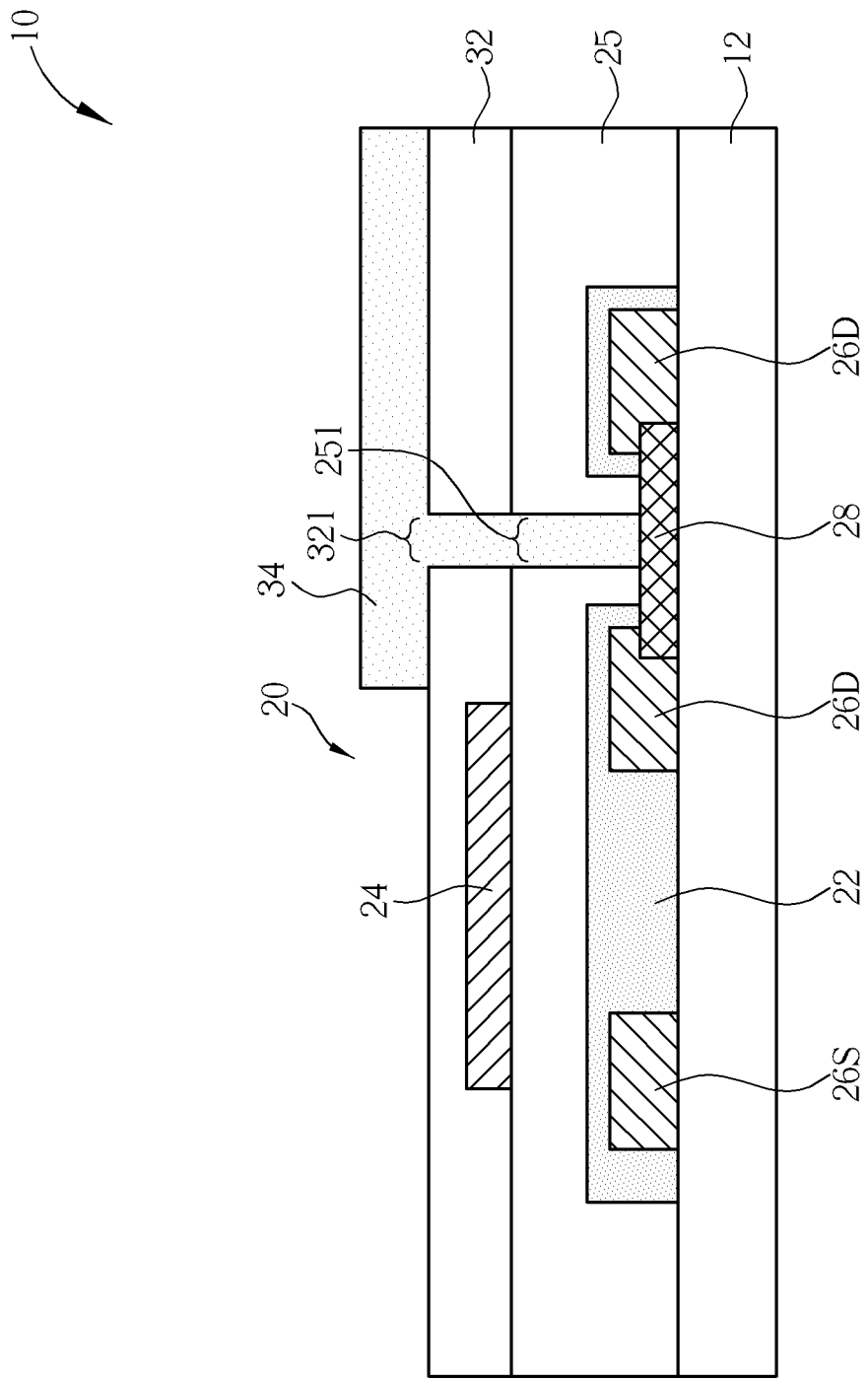
FIG. 1 is a schematic diagram illustrating a pixel structure of a first preferred embodiment of the present invention.

Please refer to FIG. 1. FIG. 1 is a schematic diagram illustrating a pixel structure of a first preferred embodiment of the present invention. As shown in FIG. 1, the pixel structure 10 of this embodiment is disposed on a substrate 12, and the pixel structure 10 includes a thin film transistor device 20, an insulating layer (also referred to as a passivation layer) 32, and a pixel electrode 34. The thin film transistor device 20 includes a semiconductor layer 22 disposed on the substrate 12, a gate electrode 24 disposed on the substrate, a gate insulating layer 25 disposed between the semiconductor layer 22 and the gate electrode 24, two source/drain electrodes 26S, 26D disposed on the substrate 12 and corresponding to two opposite sides of the semiconductor layer 22, respectively, and a floating conductive pad 28 disposed on the substrate 12 and disposed at one side of the semiconductor layer 22. The source/drain electrode 26D partially covers the floating conductive pad 28 and contacts the floating conductive pad 28, thereby electrically connecting to the floating conductive pad 28. The source/drain electrode 26D also at least partially exposes the floating conductive pad 28. In addition, the insulating layer 32 is disposed on the thin film transistor device 20, and the insulating layer 32 has a first contact hole 321. The first contact hole 321 partially exposes the floating conductive pad 28, but does not expose the source/drain electrodes 26S, 26D. Furthermore, the gate insulating layer 25 has a second contact hole 251 at least partially exposes the floating conductive pad 28. The pixel electrode 34 is disposed on the insulating layer 32, and electrically connected to the floating conductive pad 28 via the first contact hole 321 and the second contact hole 251. The floating conductive pad 28 only electrically connects to the source/drain electrode 26D and the pixel electrode 34, but electrically disconnected from other signal sources. Thus, the floating conductive pad 28 can be considered as in a floating state. Also, the source/drain electrode 26S may be electrically connected to a data line (not shown).

In this embodiment, the thin film transistor device 20 is a top-gate type thin film transistor device. The source/drain electrodes 26S, 26D are disposed between the substrate 12 and the semiconductor layer 22, the gate insulating layer 25 is disposed on the semiconductor layer 22, the gate electrode 24 is disposed on the gate insulating layer 25, and the insulating layer 32 is disposed on the gate electrode 24 and the gate insulating layer 25. In this embodiment, the semiconductor layer 22 is disposed on the source/drain electrodes 26S, 26D, and the semiconductor layer 22 at least covers one of the source/drain electrodes 26S, 26D. In other embodiment, the semiconductor layer 22 could cover partial source/drain electrodes 26S, 26D and expose partial source/drain electrodes 26S, 26D. In addition, in this embodiment, the floating conductive pad 28 is disposed between the substrate 12 and the source/drain electrode 26D, and the source/drain electrode 26D partially covers the floating conductive pad 28 and partially exposes the floating conductive pad 28. In addition, in this embodiment, the semiconductor layer 22 is in direct contact with a portion of the floating conductive pad 28, but not limited thereto. For instance, the semiconductor layer 22 may not be in contact with the floating conductive pad 28. Also, the first contact hole 321 and the second contact hole 251 may be formed by the same photolithography and etching process, but not limited thereto.

In the present invention, the semiconductor layer 22 is preferably an organic semiconductor layer for its characteristics of flexibility and compatibility of low temperature process. For example, the material of the organic semiconductor layer may be small molecular compound, polymer or organometallic complex, but not limited thereto. Also, to enhance the electrical charge injection efficiency between the source/drain electrodes 26S, 26D and the semiconductor layer 22, the material of the source/drain electrodes 26S, 26D preferably includes one of silver, aluminum, copper, and magnesium, or a composite layer of the aforementioned materials, or an alloy of the aforementioned materials. The material of the floating conductive pad 28 includes an antioxidant material. Considering that the material of the source/drain electrodes 26S, 26D tends to be oxidized or decayed due to the composition of the etchant gas for forming the first contact hole 321 such as oxygen, sulfur, fluorine, chlorine, etc, which would cause poor electrical connection between the source/drain electrodes 26S, 26D and the pixel electrode 34 to be formed successively. The first contact hole 321 and the second contact hole 251 only expose the floating conductive pad 28, but does not expose the source/drain electrodes 26S, 26D. In addition, the material of the floating conductive pad 28 preferably includes an antioxidant material. For example, the antioxidant material may include at least one of titanium, molybdenum, tungsten, gold, platinum, chromium, nickel, palladium and cobalt, or a composite layer of the aforementioned materials, or an alloy of the aforementioned materials. The antioxidant material may also include metal oxide conductive material such as at least one of indium tin oxide (ITO), indium zinc oxide (IZO), and fluorine-doped zinc oxide (FZO), or the antioxidant material may also include metal nitride conductive material such as at least one of titanium nitride (TiN) and molybdenum nitride (MoN). In addition, the floating conductive pad 28 may include a single-layered floating conductive pad or a composite-layered floating conductive pad. The insulating layer 32 may be a single-layered insulating layer or a composite-layered insulating layer, and the insulating layer 32 may be an inorganic insulating layer, an organic insulating layer or inorganic/organic stacking insulating layer.

By virtue of the aforementioned configuration, the first contact hole 321 and the second contact hole 251 only expose the floating conductive pad 28 but doesn't expose the source/drain electrodes 26S, 26D, and thus the source/drain electrodes 26S, 26D will not be oxidized. Consequently, a good electric charge injection interface between the source/drain electrodes 26S, 26D and the semiconductor layer 22 can be ensured. Also, since the floating conductive pad 28 is made of antioxidant material, the floating conductive pad 28 will not be damaged during the formation of the first contact hole 321 and the second contact hole 251, which can enhance a good electrical connection between the floating conductive pad 28 and the pixel electrode 34.

The pixel structure of the present invention is not limited to the aforementioned embodiment. The pixel structure of different embodiments of the present invention will be illustrated in the following passages. To simplify the description, the identical components in each of the following embodiments are marked with identical symbols. For making it easier to compare the difference between the embodiments, the following description will detail the dissimilarities among different embodiments and the identical features will not be redundantly described.

Figure 2:
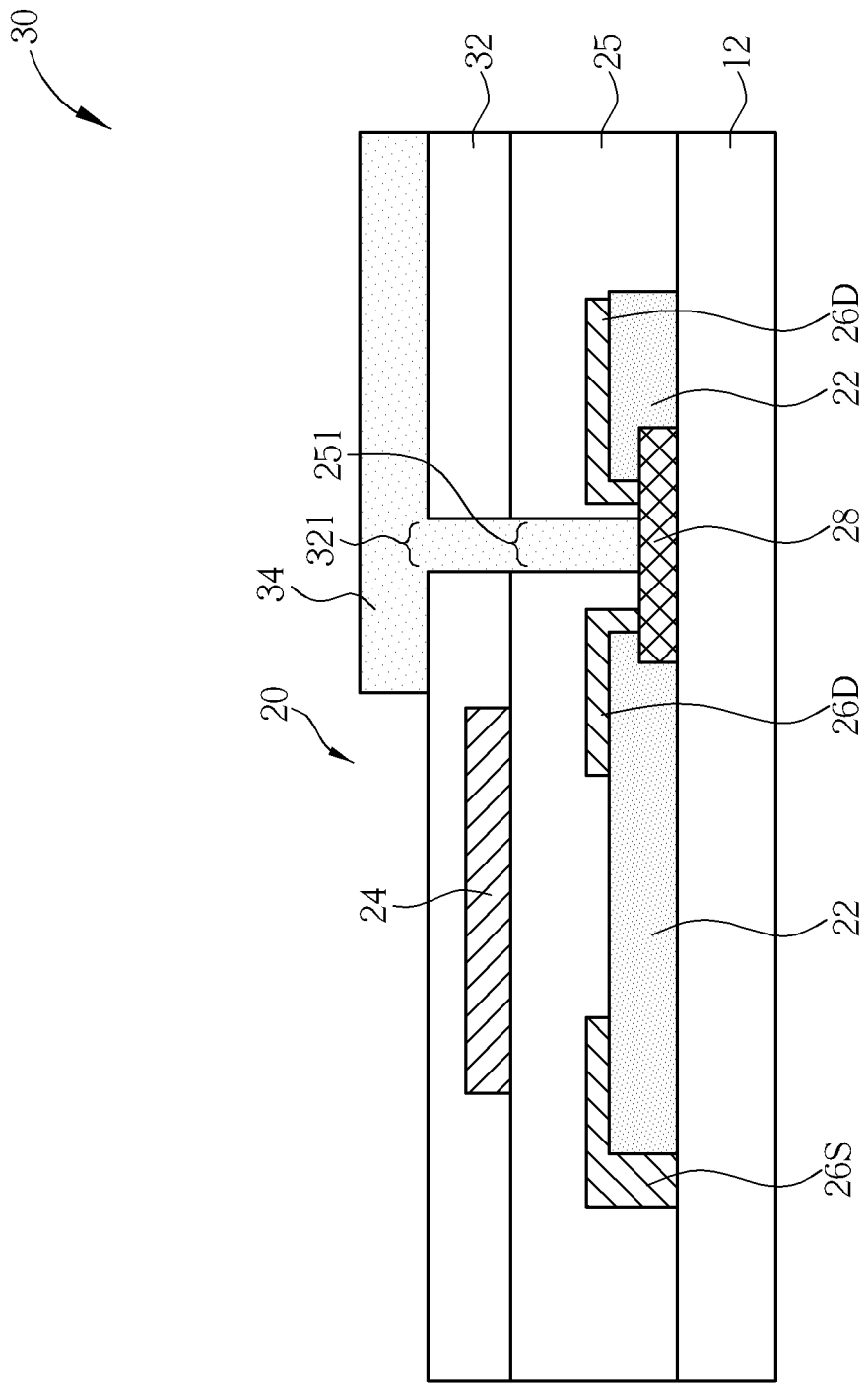
FIG. 2 is a schematic diagram illustrating a pixel structure according to a variant embodiment of the first preferred embodiment of the present invention.

Please refer to FIG. 2. FIG. 2 is a schematic diagram illustrating a pixel structure according to a variant embodiment of the first preferred embodiment of the present invention. As shown in FIG. 2, the thin film transistor device 20 of the pixel structure 30 of this variant embodiment is also a top-gate type thin film transistor device. Different from the thin film transistor device of FIG. 1, the semiconductor layer 22 is disposed between the source/drain electrodes 26S, 26D and the substrate 12, the gate insulating layer 25 is disposed on the semiconductor layer 22 and the source/drain electrodes 26S, 26D, the source/drain electrode 26D partially covers the floating conductive pad 28 and electrically connected to the floating conductive pad 28, and the gate electrode 24 is disposed on the gate insulating layer 25.

Figure 3:
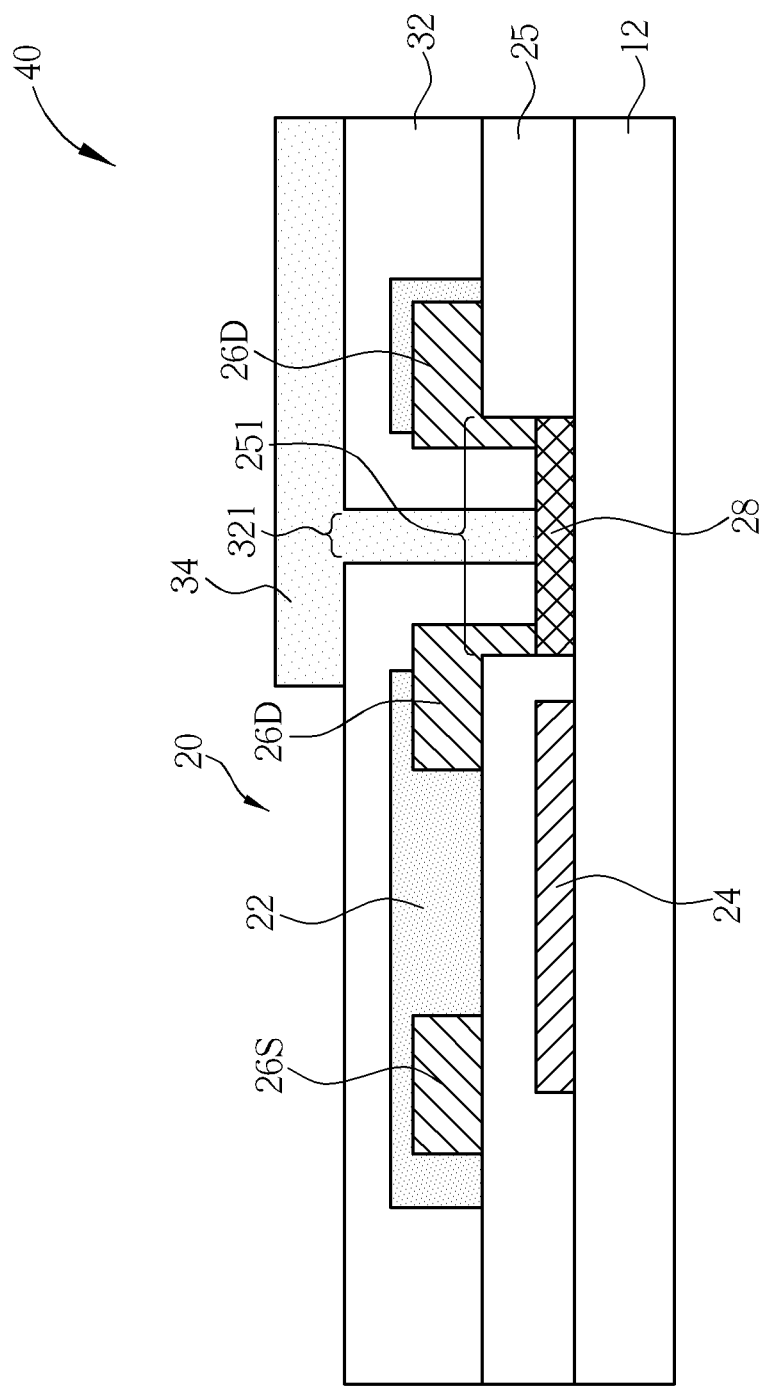
FIG. 3 is a schematic diagram illustrating a pixel structure according to a second preferred embodiment of the present invention.

Please refer to FIG. 3. FIG. 3 is a schematic diagram illustrating a pixel structure according to a second preferred embodiment of the present invention. As shown in FIG. 3, different from the first embodiment, the thin film transistor device 20 of the pixel structure 40 in this embodiment is a bottom-gate type thin film transistor device. Accordingly, the gate electrode 24 is disposed between the substrate 12 and the gate insulating layer 25, the semiconductor layer 22 is disposed on the gate insulating layer 25, the source/drain electrodes 26S, 26D are disposed between the gate insulating layer 25 and the semiconductor layer 22, and the insulating layer 32 is disposed on the gate insulating layer 25, the source/drain electrodes 26S, 26D and the semiconductor layer 22. In addition, the floating conductive pad 28 is disposed between the substrate 12 and the gate insulating layer 25, and the first contact hole 321 partially exposes the floating conductive pad 28. In this embodiment, the semiconductor layer 22 is disposed on the source/drain electrodes 26S, 26D, and the semiconductor layer 22 at least covers one of the source/drain electrodes 26S, 26D. In other embodiment, the semiconductor layer 22 could cover partial source/drain electrodes 26S, 26D and expose partial source/drain electrodes 26S, 26D. The source/drain electrode 26D partially fills into the second contact hole 251, partially covers the floating conductive pad 28 and partially exposes the floating conductive pad 28. The floating conductive pad 28 is not in contact with the semiconductor layer 22, but not limited thereto.

Similarly, by virtue of the aforementioned configuration, the source/drain electrode 26D only partially fills into the second contact hole 251, and contact the floating conductive pad 28, but the first contact hole 321 only exposes the floating conductive pad 28 without exposing the source/drain electrodes 26S, 26D. Thus, the source/drain electrodes 26S, 26D will not be oxidized. In addition, the floating conductive pad 28 is made of antioxidant material, and thus will not be damaged in the formation of the first contact hole 321. As a result, a good electrical connection between the floating conductive pad 28 and the pixel electrode 34 can be ensured.

Figure 4:
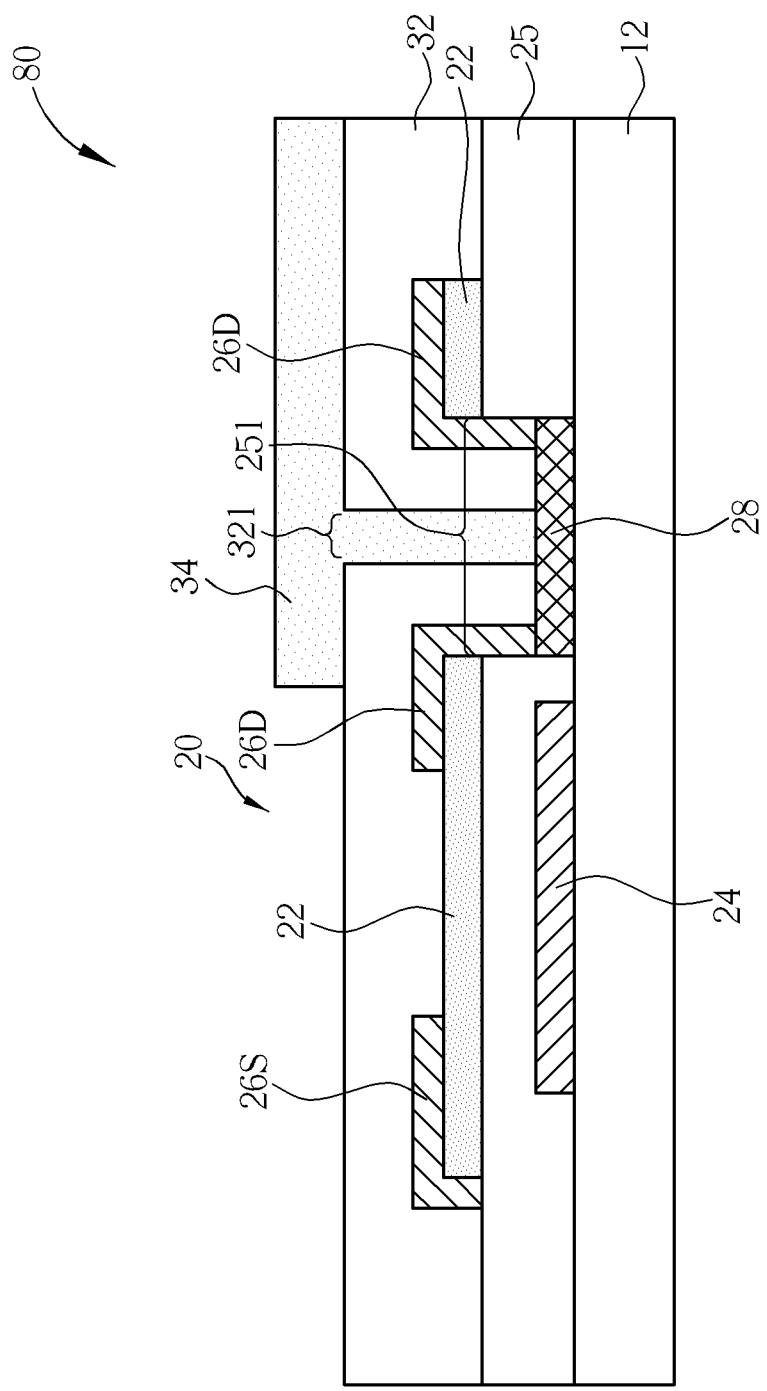
FIG. 4 is a schematic diagram illustrating a pixel structure according to a variant embodiment of the second preferred embodiment of the present invention.

Please refer to FIG. 4. FIG. 4 is a schematic diagram illustrating a pixel structure according to a variant embodiment of the second preferred embodiment of the present invention. As shown in FIG. 4, the thin film transistor device 20 of the pixel structure 80 of this variant embodiment is also a bottom-gate type thin film transistor device. Different from the thin film transistor device of FIG. 3, the gate electrode 24 is disposed between the substrate 12 and the gate insulating layer 25, the second contact hole 251 of the gate insulating layer 25 partially exposes the floating conductive pad 28, the semiconductor layer 22 is disposed on the gate insulating layer 24, the source/drain electrodes 26S, 26D are disposed on the gate insulating layer 25 and the semiconductor layer 22, and the source/drain electrode 26D partially fills into the second contact hole 251 and electrically connects to the floating conductive pad 28.

Figure 5:
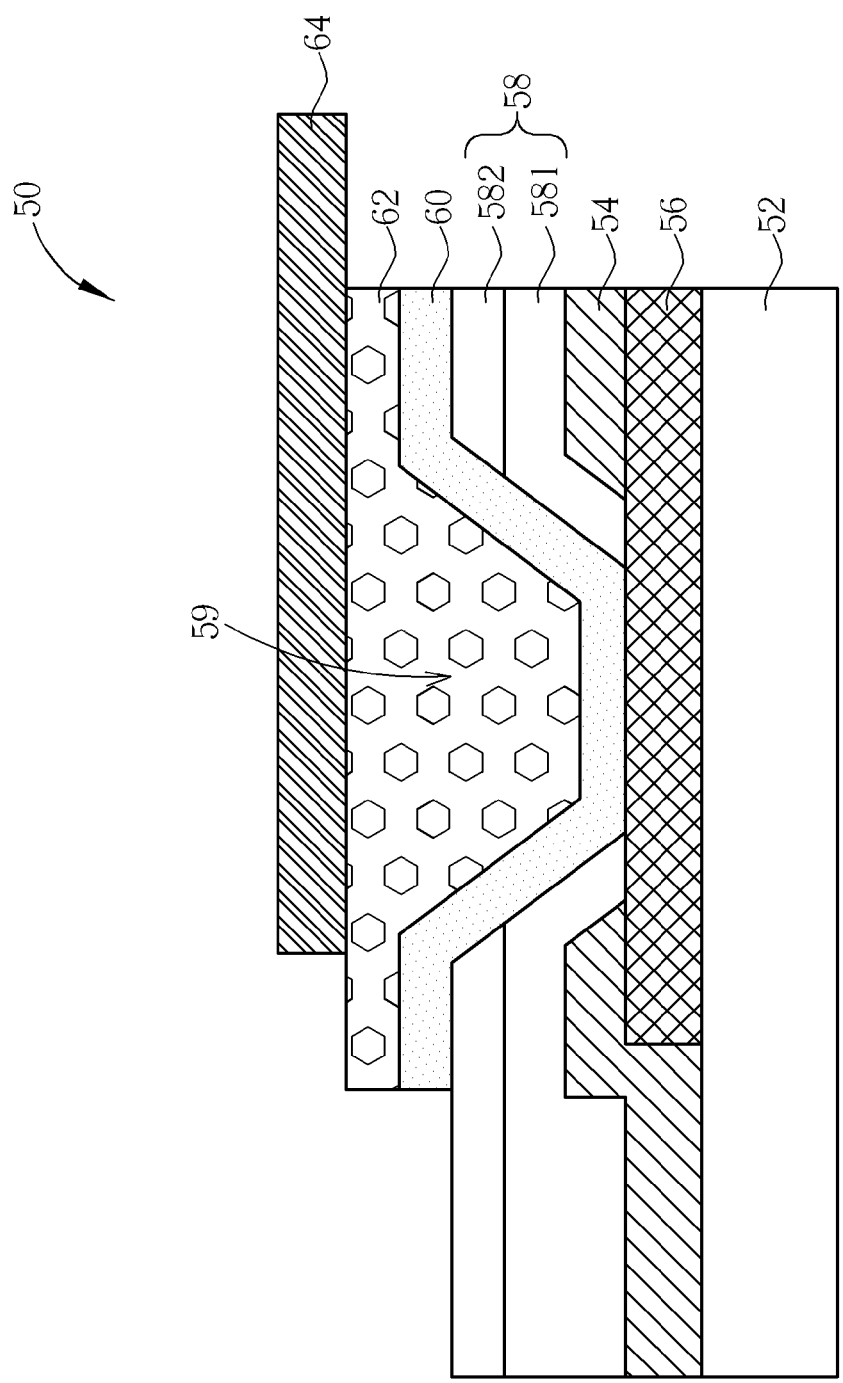
FIG. 5 is a schematic diagram illustrating an electrical bridging structure according to a third preferred embodiment of the present invention.

The design of the floating conductive pad of the present invention is not limited to be applied in the pixel structure of a display panel, and may be applied in other structures of the display panel. For example, the floating conductive pad may be applied to an electrical bridging structure of the display panel in the peripheral region. Please refer to FIG. 5. FIG. 5 is a schematic diagram illustrating an electrical bridging structure according to a third preferred embodiment of the present invention. As shown in FIG. 5, the electrical bridging structure 50 of this embodiment is disposed on a substrate 52, and the electrical bridging structure 50 includes a conductive line 54, a floating conductive pad 56, an insulating layer 58 and a conductive layer 60. The conductive line 54 is disposed on the substrate 52, and the conductive line 54 may be e.g. gate lines, data lines, common lines, or any conductive lines of the display panel that require to be electrically connected to external devices or to one another. The material of the conductive line 54 preferably includes one of silver, aluminum, copper, and magnesium, or a composite layer of the aforementioned materials, or an alloy of the aforementioned materials. The floating conductive pad 56 is disposed on the substrate 52, and electrically connected to the conductive line 54. The material of the floating conductive pad 56 includes an antioxidant material. For example, the antioxidant material may include at least one of titanium, molybdenum, tungsten, gold, platinum, chromium, nickel, palladium and cobalt, or a composite layer of the aforementioned materials, or an alloy of the aforementioned materials. The antioxidant material may also include metal oxide conductive material such as at least one of indium tin oxide (ITO), indium zinc oxide (IZO), and fluorine-doped zinc oxide (FZO), or the antioxidant material may also include metal nitride conductive material such as at least one of titanium nitride (TiN) and molybdenum nitride (MoN). In addition, the floating conductive pad 56 may include a single-layered floating conductive pad or a composite-layered floating conductive pad. The insulating layer 58 is disposed on the floating conductive pad 56, and the insulating layer 58 has a contact hole 59 partially exposing the floating conductive pad 56 but not exposing the conductive line 54. The insulating layer 58 may includes a dielectric layer 581, and a passivation layer 582 disposed on the dielectric layer 581. In this embodiment, the conductive line 54 is disposed under the dielectric layer 581 and the passivation layer 582. The dielectric layer 581 and the passivation layer 582 of the insulating layer 58 may be a single-layered structure or a composite-layered structure, respectively. The material of the dielectric layer 581 and the passivation layer 582 may be inorganic or organic. The conductive layer 60 is disposed on the insulating layer 58, and electrically connected to the floating conductive pad 56 via the contact hole 59. In this embodiment, the conductive layer 60 may be, for example, a transparent conductive layer, for protecting the conductive line 54 and the floating conductive pad 56, and for enabling the conductive line 54 and the floating conductive pad 56 to create an electrical connection with external devices. The electrical bridging structure 50 of this embodiment may further include a conductive adhesive 62 and a driving chip 64. The driving chip 64 may be e.g. a chip on film (COF), while the conductive adhesive 62 may be e.g. an anisotropic conductive film (ACF) disposed between the conductive layer 60 and the driving chip 64 to adhere the conductive layer 60 and the driving chip 64, and to create an electrical connection between the conductive layer 60 and the driving chip 64. Consequently, signals can be delivered to the conductive line 54 from the driving chip 64.

In this embodiment, the contact hole 59 does not expose the conductive line 54 but exposes the floating conductive pad 56. The floating conductive pad 56 made of antioxidant material can prevent the conductive line 54 from being oxidized or decayed.

Figure 6:
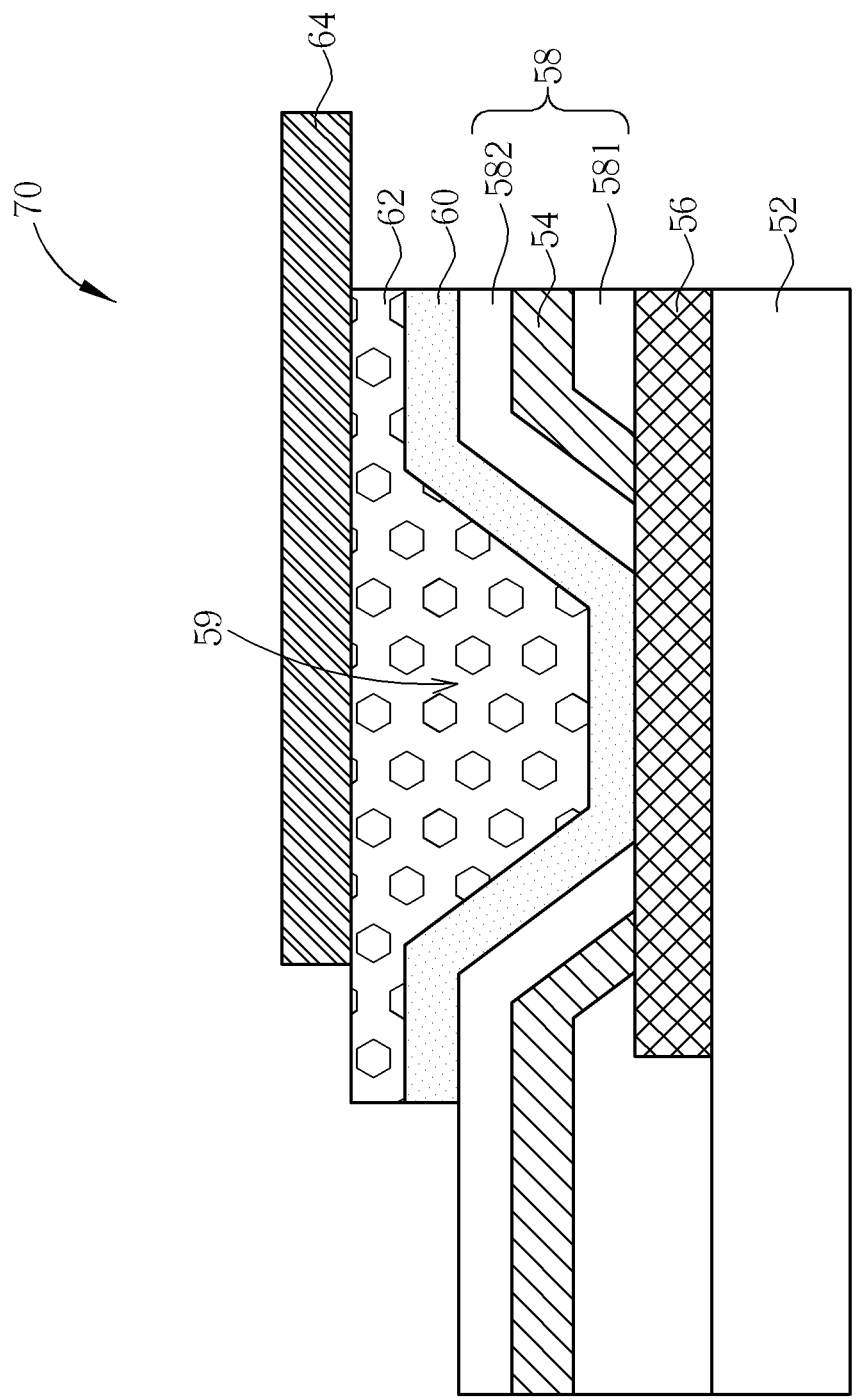
FIG. 6 is a schematic diagram illustrating an electrical bridging structure according to a fourth preferred embodiment of the present invention.

Please refer to FIG. 6. FIG. 6 is a schematic diagram illustrating an electrical bridging structure according to a fourth preferred embodiment of the present invention. As shown in FIG. 6, different from the third preferred embodiment, the conductive line 54 of the electrical bridging structure 70 of this embodiment is disposed between the dielectric layer 581 and the passivation layer 582 of the insulating layer 58, and electrically connected to the floating conductive pad 56.

In conclusion, the pixel structure and the electrical bridging structure of the present invention include the floating conductive pad, and the contact hole of the insulating layer only exposes the floating conductive pad made of antioxidant material, but does not expose the source/drain electrode or the conductive line that is apt to be oxidized. Thus, the source/drain electrode or the conductive line is prevented from being oxidized, which ensures the electrical performance of display panel.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A pixel structure, disposed on a substrate, the pixel structure comprising:
 a thin film transistor device, disposed on the substrate, the thin film transistor device comprising:
  a semiconductor layer, disposed on the substrate, wherein the semiconductor layer comprises an organic semiconductor layer;
  a gate electrode, disposed on the substrate;
  a gate insulating layer, disposed between the semiconductor layer and the gate electrode;

two source/drain electrodes, disposed on the substrate and corresponding to two opposite sides of the semiconductor layer, respectively; and a floating conductive pad, disposed on the substrate and disposed at one side of the semiconductor layer, wherein the floating conductive pad is electrically connected to one of the source/drain electrodes;

an insulating layer, disposed on the thin film transistor device, wherein the insulating layer has a first contact hole partially exposing the floating conductive pad; and a pixel electrode, disposed on the insulating layer and electrically connected to the floating conductive pad via the first contact hole.

2. The pixel structure of claim 1, wherein a material of the source/drain electrodes comprises at least one of silver, aluminum, copper, and magnesium, or a composite layer thereof, or an alloy thereof.

3. The pixel structure of claim 1, wherein the floating conductive pad comprises a single-layered floating conductive pad or a composite-layered floating conductive pad.

4. The pixel structure of claim 1, wherein a material of the floating conductive pad comprises an antioxidant material.

5. The pixel structure of claim 4, wherein the antioxidant material comprises at least one of titanium, molybdenum, tungsten, gold, platinum, chromium, nickel, palladium and cobalt, or a composite layer thereof, or an alloy thereof.

6. The pixel structure of claim 4, wherein the antioxidant material comprises a metal oxide conductive material or a metal nitride conductive material.

7. The pixel structure of claim 1, wherein the first contact hole of the insulating layer does not expose the source/drain electrodes.

8. The pixel structure of claim 1, wherein the source/drain electrodes are disposed between the substrate and the semiconductor layer, one of the source/drain electrodes partially covers the floating conductive pad, the gate insulating layer is disposed on the semiconductor layer, the gate insulating layer has a second contact hole partially exposing the floating conductive pad, and the gate electrode is disposed on the gate insulating layer.

9. The pixel structure of claim 8, wherein the semiconductor layer covers at least one of the source/drain electrodes.

10. The pixel structure of claim 1, wherein the semiconductor layer is disposed between the source/drain electrodes and the substrate, the gate insulating layer is disposed on the semiconductor layer and the source/drain electrodes, the gate insulating layer has a second contact hole partially exposing the floating conductive pad, and the gate electrode is disposed on the gate insulating layer.

11. The pixel structure of claim 1, wherein the gate electrode is disposed between the substrate and the gate insulating layer, the gate insulating layer has a second contact hole partially exposing the floating conductive pad, the semiconductor layer is disposed on the gate insulating layer, the source/drain electrodes are disposed between the gate insulating layer and the semiconductor layer, and one of the source/drain electrodes partially fills into the second contact hole and partially covers the floating conductive pad.

12. The pixel structure of claim 11, wherein the semiconductor layer covers at least one of the source/drain electrodes.

13. The pixel structure of claim 1, wherein the gate electrode is disposed between the substrate and the gate insulating layer, the gate insulating layer has a second contact hole partially exposing the floating conductive pad, the semiconductor layer is disposed on the gate insulating layer, the source/drain electrodes are disposed on the gate insulating layer and the semiconductor layer, and one of the source/drain electrodes partially fills into the second contact hole and electrically connects to the floating conductive pad.

14. An electrical bridging structure, disposed on a substrate, the electrical bridging structure comprising:

a conductive line, disposed on the substrate, wherein a material of the conductive line comprises at least one of silver, aluminum, copper, and magnesium, or a composite layer thereof, or an alloy thereof;

a floating conductive pad, disposed on the substrate and electrically connected to the conductive line, wherein a material of the floating conductive pad comprises an antioxidant material;

an insulating layer, disposed on the floating conductive pad, the insulating layer having a contact hole partially exposing the floating conductive pad, wherein the contact hole does not expose the conductive line; and a conductive layer, disposed on the insulating layer and electrically connected to the floating conductive pad via the contact hole.

15. The electrical bridging structure of claim 14, wherein the floating conductive pad comprises a single-layered floating conductive pad or a composite-layered floating conductive pad.

16. The electrical bridging structure of claim 14, wherein the antioxidant material comprises at least one of titanium, molybdenum, tungsten, gold, platinum, chromium, nickel, palladium and cobalt, or a composite layer thereof, or an alloy thereof.

17. The electrical bridging structure of claim 14, the antioxidant material comprises a metal oxide conductive material or a metal nitride conductive material.

18. The electrical bridging structure of claim 14, wherein the conductive layer comprises a transparent conductive layer.

19. The electrical bridging structure of claim 14, wherein the insulating layer comprises a dielectric layer and a passivation layer disposed on the dielectric layer.

20. The electrical bridging structure of claim 19, wherein the conductive line is disposed under the dielectric layer and the passivation layer.

21. The electrical bridging structure of claim 19, wherein the conductive line is disposed between the dielectric layer and the passivation layer.

* * * * *